(12) United States Patent
Beintner

(10) Patent No.: US 6,893,911 B2
(45) Date of Patent: May 17, 2005

(54) PROCESS INTEGRATION FOR INTEGRATED CIRCUITS

(75) Inventor: Jochen Beintner, Wappingers Falls, NY (US)

(73) Assignee: Infineon Technologies Aktiengesellschaft, Munich (DE)

( * ) Notice: Subject to any disclaimer, the term of this patent is extended or adjusted under 35 U.S.C. 154(b) by 221 days.

(21) Appl. No.: 10/249,100

(22) Filed: Mar. 16, 2003

(65) Prior Publication Data

US 2004/0180547 A1 Sep. 16, 2004

(51) Int. Cl.$^7$ .......................................... H01L 21/8238
(52) U.S. Cl. ...................... 438/221; 438/691; 438/745; 257/506; 257/510
(58) Field of Search ................................ 438/221, 315, 438/691–693, 700, 719, 745, 756, 757; 257/315, 321, 396, 506–515

(56) References Cited

U.S. PATENT DOCUMENTS

| | | | | |
|---|---|---|---|---|
| 6,034,393 A | * | 3/2000 | Sakamoto et al. | 257/315 |
| 6,358,818 B1 | * | 3/2002 | Wu | 438/431 |
| 6,683,364 B2 | * | 1/2004 | Oh et al. | 257/510 |
| 2001/0018241 A1 | * | 8/2001 | Jeong | 438/200 |
| 2001/0021567 A1 | * | 9/2001 | Takahashi | 438/424 |

OTHER PUBLICATIONS

Weis, et al., "A Highly Cost Efficient 8F$^2$ DRAM Cell with a Double Gate Vertical Transistor Device for 100 nm and Beyond," International Electron Device Meeting IEDM, Washington (2001).

* cited by examiner

*Primary Examiner*—Duy-Vu N. Deo
(74) *Attorney, Agent, or Firm*—Slater & Matsil, L.L.P.

(57) ABSTRACT

A process for fabricating integrated circuits is disclosed. In particular, the process includes rounding corners of the active regions. In one embodiment, a substrate prepared with a support region having an active area between first and second trench isolations. The top surfaces of the trench isolations extend above the surface of the substrate. First and second etch stop layers are deposited on the substrate, lining the substrate surface and trench isolations without filling the gap. The etch stop layers can be etched selective to each other and layers beneath and or above. The second etch stop layer includes horizontal and vertical portions. An etch selectively removes the vertical portions of the etch stop layer. An isotropic etch is then performed, removing exposed portions of the first etch stop layer. The second etch stop layer acts as an etch mask. The etch also creates an undercut beneath the second etch stop layer, exposing edge portions of the active area. The second etch stop layer is removed, following by oxidizing the edge portions of the active area unprotected by the first etch stop layer.

14 Claims, 8 Drawing Sheets

PROCESS INTEGRATION FOR INTEGRATED CIRCUITS

BACKGROUND OF INVENTION

An integrated circuit can have millions of circuit features, such as transistors and capacitors, formed on a chip. Some ICs include an array of memory cells for storing information. To access the memory cells, addressing circuitry such as decoders, drivers and sense amplifiers (generally referred to as support circuitry) are provided. The chip is separated into array and support regions in which memory cells and support circuitry are respectively located. One type of memory cell 105 includes a trench capacitor coupled to a vertical transistor 130, as shown in FIG. 1. Such types of memory cells are described in, for example, Weis et. al., "A Highly Cost Efficient $8F^2$ DRAM Cell with a Double Gate Vertical Transistor Device for 100 nm and Beyond", International Electron Device Meeting IEDM, Washington (2001), which is herein incorporated by reference for all purposes. The capacitor is formed in a lower portion 111a of a trench created in a substrate 106. The upper portion 111b of the trench comprises a gate 133 of the vertical transistor. A trench top oxide 148 is located in the trench between the transistor and capacitor, providing isolation between the two. The capacitor is coupled to the transistor via a buried strap 174 and buried diffusion region 132. A gate oxide 135 lines the trench sidewall in the upper portion of the trench. A diffusion region 131 is located on the substrate surface surrounding the trench. A wordline is coupled to the gate and a bitline is coupled to the diffusion region.

Unfortunately, circuit requirements for the memory cells and support circuitry are different. For example, current integration processes for vertical array memory cells result in an insufficient active area corner rounding for support devices. This can undesirably lead to performance degradation for support devices.

From the foregoing discussion, it is desirable, to provide an integration process which can accommodate for the needs of the array and support devices.

SUMMARY OF INVENTION

A process for fabricating integrated circuits including corner rounding. In one embodiment, a substrate prepared with a support region. The support region comprises first and second trench isolations, wherein a trench isolation includes a dielectric material formed in a trench. The dielectric material extends above the surface of the substrate to form a gap between the trench isolations. An active area is located in the gap between the trench isolations.

First and second etch stop layers are deposited on the substrate, lining the substrate surface and trench isolations without filling the gap. The second etch stop layer comprises horizontal and vertical portions. The vertical portion of the second etch stop layer is removed, leaving the horizontal portions remaining. An isotropic etch is performed to selectively remove exposed portions of the first etch stop layer while leaving the second etch stop layer. The isotropic etch also removes a portion of the first etch stop layer under the second etch stop layer to create an undercut, exposing edge portions of the active area. The second etch stop layer is removed, following by oxidizing the edge portions of the active region unprotected by the first etch stop layer.

DETAILED DESCRIPTION

The invention relates to the fabrication of ICs with memory cells. The ICs, for example, are memory ICs. Other types of ICs, such as system on chip, are also useful. In one embodiment, the invention relates to the fabrication of memory cells having a trench capacitor coupled to a vertical transistor. Preferably, the memory cells are formed without compromising performance by sacrificing the needs of support devices. More preferably, the active areas in the support region are provided with sufficient corner rounding.

Typically, in IC fabrication, a plurality of ICs are formed on the wafer in parallel. After processing is finished, the wafer is diced to separate the ICs into individual chips. The chips are then packaged, resulting in a final product that is used in, for example, consumer products such as computer systems, cellular phones, digital cameras, personal digital assistants (PDAs), and other products.

Figure 1:
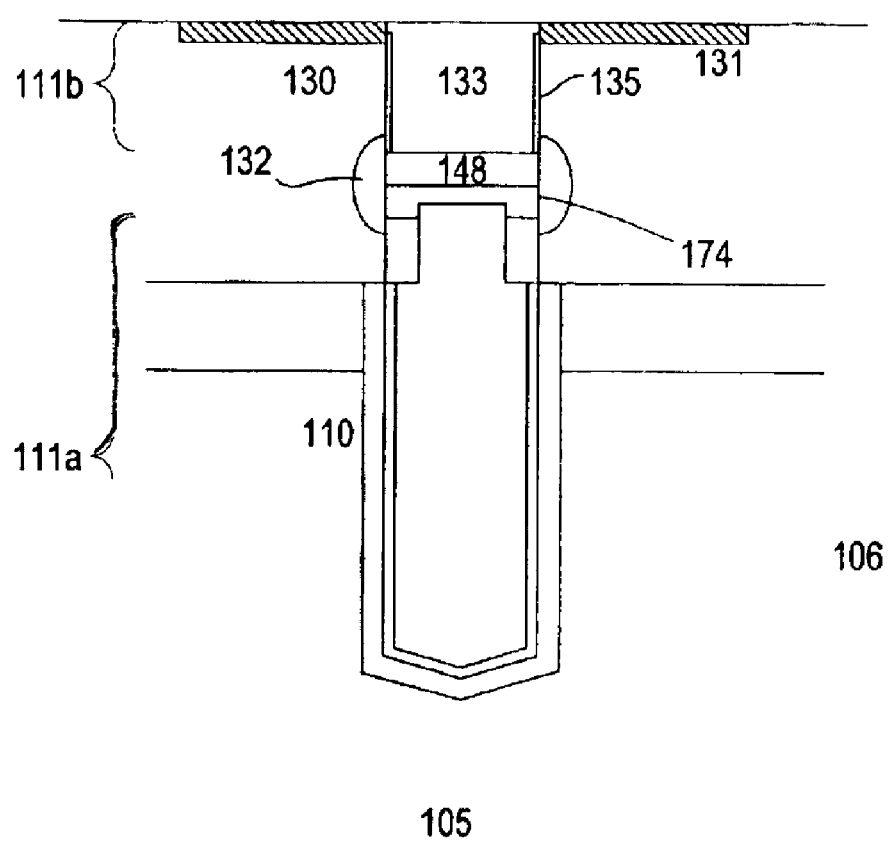
FIG. 1 shows a memory cell having a trench capacitor and vertical transistor.
Figure 2:
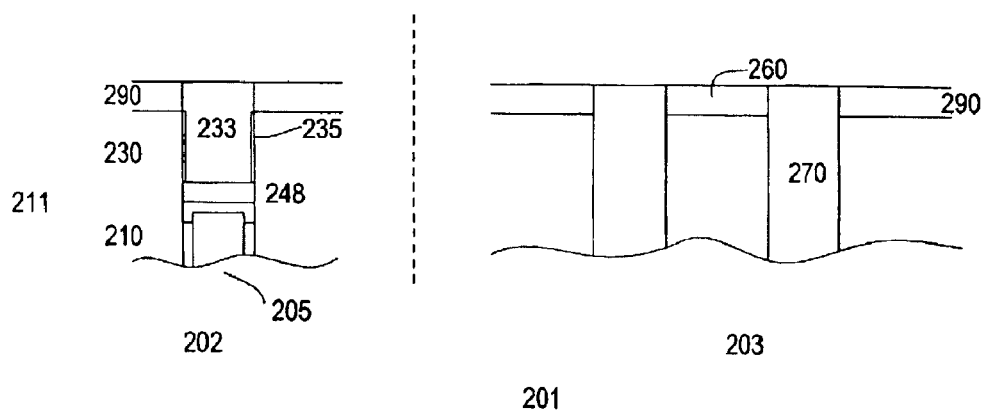
FIGS. 2–8 show a process for forming an IC in accordance with one embodiment of the invention.

FIGS. 2–8 show a process for forming an IC in accordance with one embodiment or the invention. Referring to FIG. 2, an IC 201 partially fabricated on a semiconductor substrate is shown. The substrate, for example, comprises silicon. Other types of substrates, such as silicon-on-insulator, are also useful. The substrate includes array and support regions 202–203. To facilitate processing, a pad layer 290 is provided on the substrate surface. The pad layer includes, for example, a pad oxide under a pad nitride.

The array region is prepared with a partially formed memory cell 205. In one embodiment, the partially formed memory cell includes a trench capacitor 210 formed in a lower portion of a trench 211 and a vertical transistor 230. The vertical transistor comprises a gate 233 in the upper portion of trench, separated from the capacitor by a trench top dielectric layer 248. The gate can be formed of, for example, polysilicon. The trench top dielectric comprises, for example, silicon oxide. Other types of dielectric materials are also useful.

A gate dielectric 235 is provided on the trench sidewalls in the upper portion of the trench. In one embodiment, the gate dielectric is formed from thermally grown oxide. Providing other types of gate dielectrics are also useful. As shown, the top surface of the gate is coplanar with the pad layer. A buried diffusion region can be included, coupling the capacitor to the transistor. Forming the buried diffusion later on in the process flow is also useful. Alternatively, the buried diffusion region can be partially formed as a result of thermal processes, such as gate oxide formation. Trench isolations (not shown) are provided to isolate the memory cells from each other in the array region.

The support region of the substrate is prepared with trench isolations 270 separating active areas 260 for support devices. In one embodiment, a trench isolation comprises a trench formed in the substrate and filled with dielectric material, such as silicon oxide. The dielectric material is deposited on the substrate by, for example, chemical vapor deposition. Excess dielectric material is removed from the substrate surface by, for example, chemical mechanical polishing (CMP). The CMP leaves the top surfaces of the trench isolations coplanar with the pad layer. The trench isolations in the support region can be formed at the same time as the trench isolations in the array region. The various features (e.g., trench isolations, memory cell) at this point in the process flow are formed by, for example, conventional processes. Such techniques are described in, for example, Weis et. al., "A Highly Cost Efficient 8F² DRAM Cell with a Double Gate Vertical Transistor Device for 100 nm and BeyonD", International Electron Device Meeting IEDM, Washington (2001), which is already herein incorporated by reference for all purposes.

Figure 3:
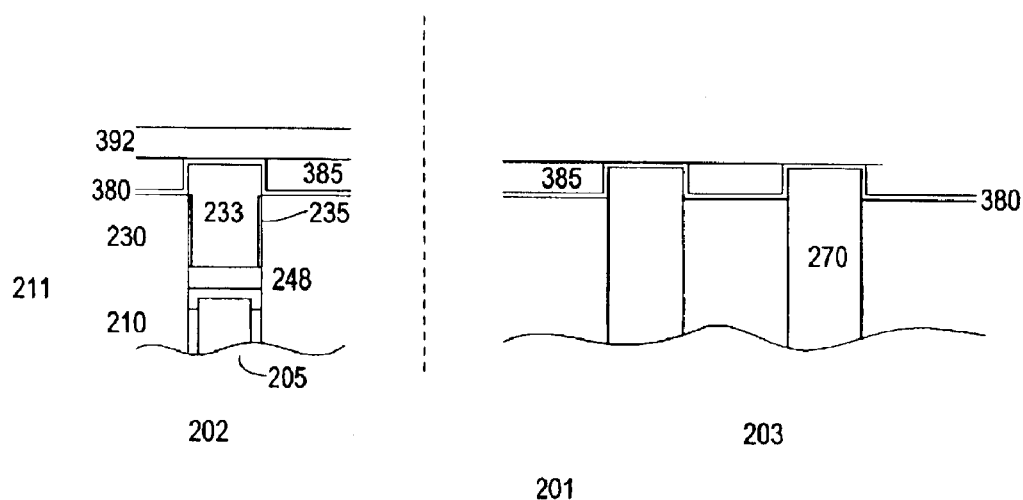

Referring to FIG. 3, the pad layer is removed. In one embodiment, an isotropic etch (e.g., wet etch) can be used to remove the pad layer. Other etch techniques can also be used. The etch is selective to the trench isolation material. In one embodiment, the etch is selective to silicon oxide. The etch removes the pad nitride, leaving the pad oxide. After the pad nitride is removed, an etch stop liner layer 380 is deposited over the substrate, lining the substrate as well as the gate conductor and trench isolations above the substrate surface. The etch stop layer comprises a material which can be etched selective to the substrate and trench isolations. In one embodiment, the etch stop layer comprises silicon nitride. Other materials which can be etched selective to the substrate and trench isolations are also useful.

A dielectric layer 385 is deposited on the substrate. The dielectric layer serves as an array top oxide layer. The dielectric layer should fill the gaps formed by the gates extending above the substrate. Preferably, the dielectric material can be etched selectively to the etch stop layer below. In one embodiment, the dielectric material comprises silicon oxide deposited by, for example, chemical vapor deposition (CVD). The array top oxide is then planarized using for example, a chemical mechanical polishing (CMP) process.

A mask layer 392 is formed over the array region, protecting it from subsequent processes. In one embodiment, the mask layer comprises a hard mask material, such as silicon nitride. Other materials which can be etched selectively to the array top oxide layer or to which it can be etched selective to the array top oxide layers are also useful. In another embodiment, the hard mask material comprises polysilicon. Preferably, the hard mask material comprises doped polysilicon (e.g, $1\times10^{10}$ $cm^{-3}$). More preferably, the hard mask material comprises polysilicon highly doped with dopants of a first type. In one embodiment, the first type comprises n-type, such as arsenic, phosphorous, or a combination thereof. Doping the hard mask material with p-type dopants is also useful. The mask layer can be deposited by, for example, chemical vapor deposition (CVD) or low pressure CVD (LPCVD). Other deposition techniques are also useful. Other hard mask materials which can be etched selectively to the array top oxide is also useful.

In one embodiment, the hard mask is formed by depositing hard mask material over the substrate and selectively removing portions from the support region using conventional etch and mask techniques. This includes, for example, depositing a photoresist mask, patterning it to leave a mask over the array region, reactive ion etching (RIE) the hard mask material to remove unprotected portion in the support region.

Figure 4:
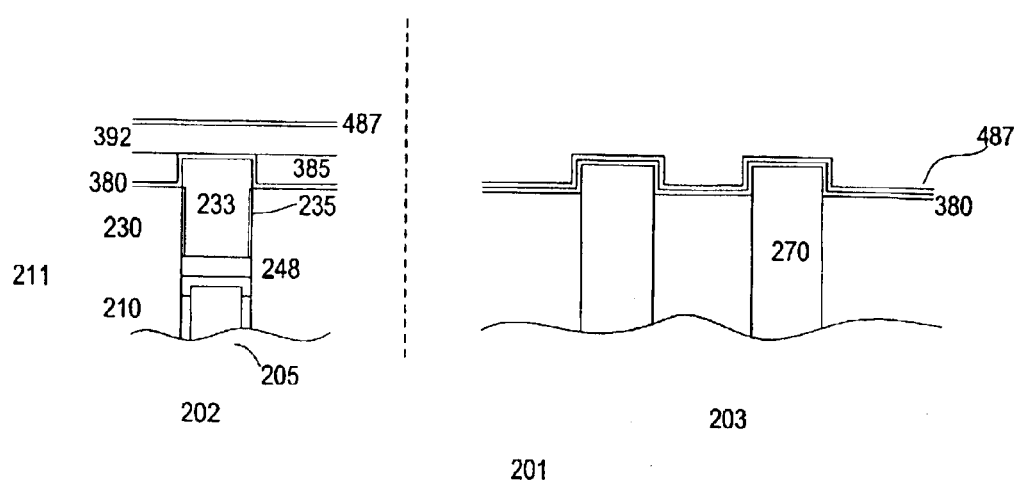

In FIG. 4, the array top oxide in the support region is removed. In one embodiment, a wet etch selective to the etch stop layer is employed to remove the array top oxide in the support region. The array top oxide in the array region, since it is protected by the hard masks, remains. A sacrificial etch stop layer 487 is then deposited on the substrate, lining the hard mask in the array region and etch stop layer in the support region. The sacrificial etch stop layer comprises a material which can be etched selectively to the etch stop layer below. In one embodiment, the sacrificial etch stop layer comprises silicon. Preferably, the sacrificial etch stop layer comprises amorphous silicon. Other materials which can be etched selectively to the etch stop layer can also be used. The amorphous silicon can be deposited by, for example, LPCVD. Other deposition techniques are also useful. The sacrificial etch stop layer, for example, is about 50–500 A. Other thicknesses are also useful.

In a preferred embodiment, the vertical components of the sacrificial etch stop layer can be etched selectively to the horizontal components. Etch selectivity between different portions of a layer can be achieved, for example, through the use of dopants. Other techniques for creating etch selectivity in horizontal and vertical portions of a layer are also useful.

In one embodiment, dopant ions are implanted into the sacrificial layer. For example, the implant comprises about $1\times10^{13}$ $1\times10^{14}$ ions/cm² at about 2–10 KeV. Preferably, dopant ions of a second type are implanted into the horizontal portions of the sacrificial etch stop layer. In one embodiment, the second type comprises p-type, such as boron. Doping the sacrificial etch stop layer with n-type dopants is also useful. The dopant ions are selectively implanted into the horizontal portions of the sacrificial etch stop layer. This can be achieved by, for example, performing the implant in a vertical direction, thereby implanting dopants in the horizontal portions of the sacrificial etch stop layer. Other techniques for selectively implanting dopants in the horizontal portion of the layer can also be useful. By selecting the appropriate chemistry, the vertical portions of the sacrificial layer can be removed while leaving the horizontal portions.

Figure 5:
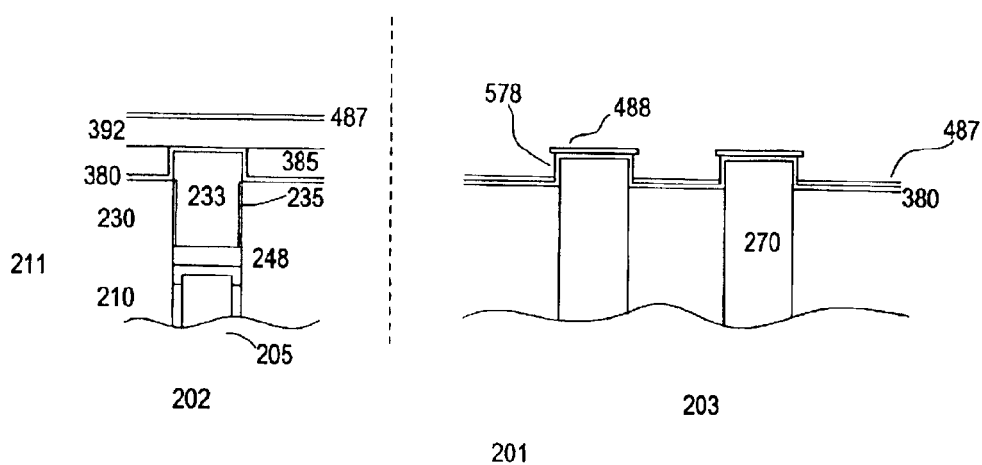
Figure 6:
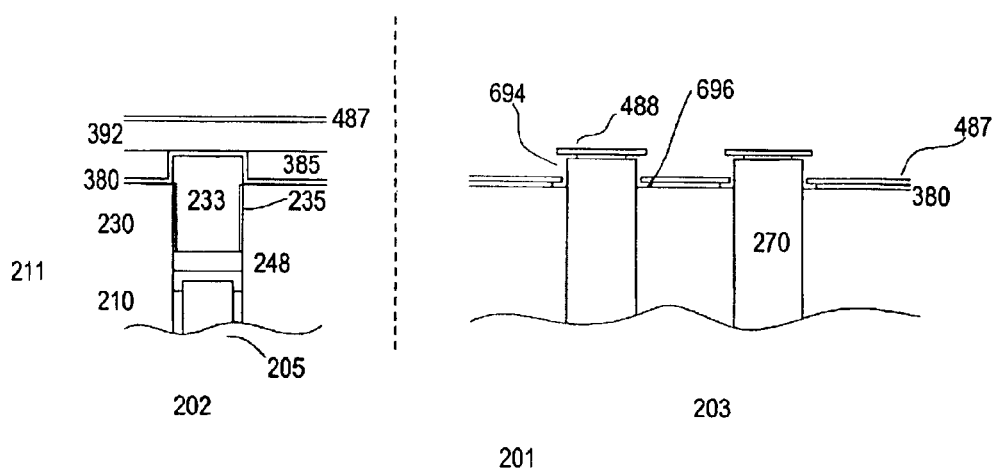

Referring to FIG. 5, an etch is performed to selectively remove the vertical portions of the sacrificial etch stop layer. As a result, portions 578 of the etch stop layer on the sidewalls of the trench isolation are exposed. An isotropic etch selective to the sacrificial etch stop layer is performed. The isotropic etch, for example, comprises a wet etch. The isotropic etch comprises a chemistry which etches the etch stop layer selective to the sacrificial etch stop layer. The etch removes the unprotected portions 694 of the etch stop layer as well as creating an undercut 696 below the sacrificial etch stop layer as shown in FIG. 6. In one embodiment, the undercut is sufficient to accommodate the corner rounding of the active area in the support region. The undercut, for example, is about 50–300 A.

Figure 7:
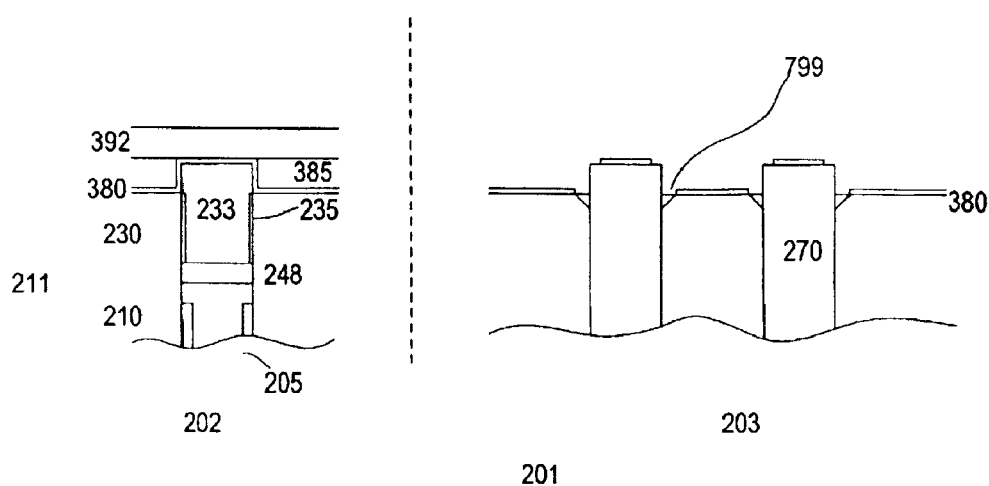
Figure 8:
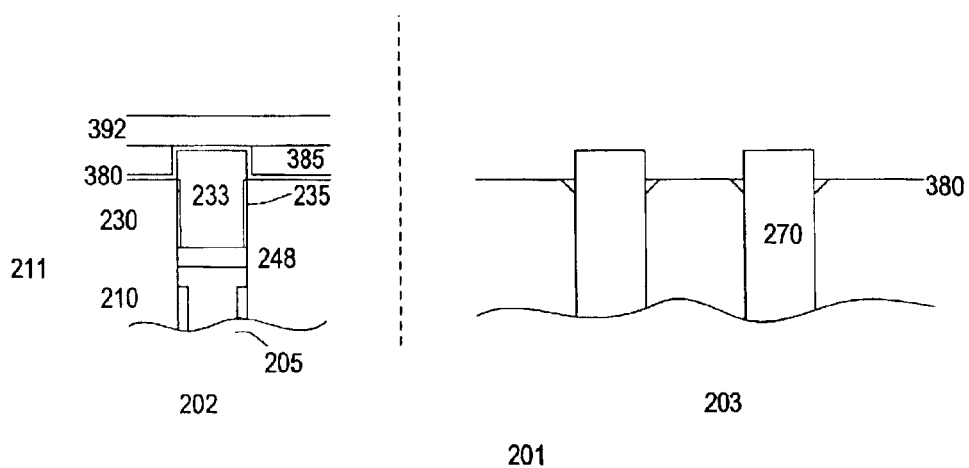

Referring to FIG. 7, the sacrificial etch stop layer is removed. In one embodiment, wet etch selective to the etch stop layer and trench isolation material is used to remove the sacrificial etch stop layer. The sacrificial etch stop layer is removed, leaving the first etch stop layer. The first etch stop layer protects the active area except edges 799 adjacent to the trench isolations. An oxidation process is performed, oxidizing portions of the substrate exposed by the first etch stop layer. This rounds the corners of the active region in the support area. In one embodiment, the oxidation process is performed at about 750–1200° C. The duration of the oxidation process depends on the temperature and target thickness of the oxidized portions of the substrate. Typically, the thickness is about 50–500 A. The first etch stop layer is removed after the oxidation process, as shown in FIG. 8. The hard mask layer in the array region is then removed by, for example, a plasma etch process. In one embodiment, the etch is selective to the array top oxide layer.

In an alternative embodiment, after the array top oxide layer is removed from the support region, the etch stop layer is patterned. In one embodiment, the etch stop layer is patterned to expose sufficient amounts of the edges of the active area in the support region. The portions of the etch stop layer on the top surface of the trench isolation and the active area can be removed by the patterning process. Patterning the etch stop layer can be achieved using conventional mask and etch techniques. After the edges of the active area are removed, an oxidation process is performed to round the corners of the active area. The remaining portions of the etch stop layer protects the active area from oxidizing.

The process flow continues to complete the IC. In one embodiment, the process flow continues to complete the IC using conventional processes. For example, support devices are formed in the support region. Also, the memory cell is completed as well as appropriate interconnections to the memory cells and support devices.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for forming an IC comprising:
   providing a substrate prepared with a first region, the first region comprising first and second trench isolations, wherein the trench isolation comprises dielectric material formed in a trench which extends above the surface of the substrate to form a gap between the trench isolations, an active area located between the trench isolations;
   depositing first and second etch stop layers lining the substrate surface and trench isolations without filling the gap, the first etch stop layer disposed beneath the second etch stop layer, the second etch stop layer includes horizontal and vertical components created by a topography of the substrate;
   removing the vertical portions of the second etch stop layer;
   isotropically etching the first etch stop layer selective to the second etch stop layer, the isotropic etch overetches the first etch stop layer to create an undercut under second etch stop layer, the undercut exposes edge portions of the active region;
   removing the second etch stop layer; and
   oxidizing the edge portions of the active area unprotected by the first etch stop layer.

2. The process of claim 1 wherein the substrate further comprises an array region having a topography, the first etch stop layer is deposited on the substrate to line the array region.

3. The process of claim 2 comprises:
   depositing an array top dielectric layer on the substrate covering the substrate after forming the first etch stop layer;
   planarizing the array top dielectric layer;
   removing the array top dielectric layer from the support region;
   depositing a hard mask layer on the surface of the substrate;
   removing the hard mask layer from the support region of the substrate; and
   depositing the second etch stop layer on the substrate.

4. The process of claim 2 wherein:
   the first etch stop layer comprises a first material which can be etched selectively to a layer beneath it or be etched selectively to by a layer above it; and
   the second etch stop layer comprises a second etch material which can be etched selectively to a layer beneath it or be etched selectively to by a layer above it.

5. The process of claim 1 wherein the substrate further comprises an array region prepared with trench capacitors with vertical transistors to serve as memory cells, the vertical transistors extending above the surface of the substrate to create the topography.

6. The process of claim 5 comprises:
   depositing an array top dielectric layer on the substrate covering the substrate after forming the first etch stop layer;
   planarizing the array top dielectric layer;
   removing the array top dielectric layer from the support region:
   depositing a hard mask layer on the surface of the substrate;
   removing the hard mask layer from the support region of the substrate; and
   depositing the second etch stop layer on the substrate.

7. The process of claim 5 wherein:
   the first etch stop layer comprises a first material which can be etched selectively to a layer beneath it or be etched selectively to by a layer above it; and
   the second etch stop layer comprises a second etch material which can be etched selectively to a layer beneath it or be etched selectively to by a layer above it.

8. The process of claim 1 comprises:
   depositing an array top dielectric layer on the substrate covering the substrate after forming the first etch stop layer;
   planarizing the array top dielectric layer;
   removing the array top dielectric layer from the support region;
   depositing a hard mask layer on the surface of the substrate;
   removing the hard mask layer from the support region of the substrate; and
   depositing the second etch stop layer on the substrate.

9. The process of claim 1 wherein:
   the first etch stop layer comprises a first material which can be etched selectively to a layer beneath it or be etched selectively to by a layer above it; and
   the second etch stop layer comprises a second etch material which can be etched selectively to a layer beneath it or be etched selectively to by a layer above it.

10. The process of claim 1 wherein the dopant ions are implanted into the horizontal components of the second etch stop layer to create etch selectivity between the horizontal and vertical components.

11. The process of claim 10 wherein the second etch stop layer comprise silicon or amorphous silicon.

12. The process of claim 11 wherein the silicon comprises amorphous silicon doped with dopant ions of a first type.

13. The process of claim 12 wherein the dopant ions of the first type comprises p-type.

14. A method for forming an IC comprising:
   providing a substrate prepared with a first region, the first region comprising first and second trench isolations, wherein the trench isolation comprises dielectric material formed in a trench which extends above the surface of the substrate to form a gap between the trench isolations, an active area located between the trench isolations;

depositing a first etch stop layer lining the substrate surface and trench isolations without filling the gap;

isotropically etching the first etch stop layer to expose edge portions of the active region; and oxidizing the edge portions of the active area unprotected by the first etch stop layer.

* * * * *